(12) United States Patent
Parekh et al.

(10) Patent No.: US 7,268,384 B2
(45) Date of Patent: Sep. 11, 2007

(54) SEMICONDUCTOR SUBSTRATE HAVING FIRST AND SECOND PAIRS OF WORD LINES

(75) Inventors: Kunal R. Parekh, Boise, ID (US); Byron N. Burgess, Boise, ID (US)

(73) Assignee: Micron Technology, Inc., Boise, ID (US)

(*) Notice: Subject to any disclaimer, the term of this patent is extended or adjusted under 35 U.S.C. 154(b) by 11 days.

(21) Appl. No.: 11/292,028

(22) Filed: Dec. 1, 2005

(65) Prior Publication Data

US 2006/0082004 A1    Apr. 20, 2006

Related U.S. Application Data

(63) Continuation of application No. 11/135,534, filed on May 23, 2005, now Pat. No. 7,008,843, which is a continuation of application No. 10/615,287, filed on Jul. 7, 2003, now Pat. No. 6,921,692.

(51) Int. Cl.
| | |
|---|---|
| H01L 29/17 | (2006.01) |
| H01L 27/84 | (2006.01) |
| H01L 27/75 | (2006.01) |
| H01L 27/85 | (2006.01) |
| H01L 27/86 | (2006.01) |
| H01L 27/88 | (2006.01) |
| H01L 27/90 | (2006.01) |
| H01L 27/91 | (2006.01) |
| H01L 27/97 | (2006.01) |

(52) U.S. Cl. .................. 257/314; 257/296; 257/68; 257/71; 257/309; 257/905; 257/70; 257/300; 257/305; 257/907; 257/906

(58) Field of Classification Search ................ 257/296, 257/314, 68, 69, 70, 71, 297, 298, 299, 300, 257/301, 309, 905, 908
See application file for complete search history.

(56) References Cited

U.S. PATENT DOCUMENTS

| | | |
|---|---|---|
| 5,250,457 A | 10/1993 | Dennison |
| 5,387,533 A | 2/1995 | Kim |
| 5,563,089 A | 10/1996 | Jost et al. |
| 5,686,747 A | 11/1997 | Jost et al. |
| 5,728,617 A | 3/1998 | Tseng |
| 5,821,140 A | 10/1998 | Jost et al. |
| 5,834,349 A | 11/1998 | Tseng |
| 5,918,122 A | 6/1999 | Parekh et al. |
| 5,981,333 A | 11/1999 | Parekh et al. |
| 6,010,935 A * | 1/2000 | Doan ................ 438/303 |
| 6,015,983 A | 1/2000 | Parekh |
| 6,037,218 A | 3/2000 | Dennison |

(Continued)

*Primary Examiner*—Wai-Sing Louie
*Assistant Examiner*—Marc-Anthony Armand
(74) *Attorney, Agent, or Firm*—Wells St. John P.S.

(57) ABSTRACT

The invention includes methods of forming memory circuitry. In one implementation, a semiconductor substrate includes a pair of word lines having a bit node received therebetween. A bit node contact opening is formed within insulative material over the bit node. Sacrificial plugging material is formed within the bit node contact opening between the pair of word lines. Sacrificial plugging material is removed from the bit node contact opening between the pair of word lines, and it is replaced with conductive material that is in electrical connection with the bit node. Thereafter, the conductive material is formed into a bit line.

35 Claims, 13 Drawing Sheets

U.S. PATENT DOCUMENTS

| | | |
|---|---|---|
| 6,060,351 A | 5/2000 | Parekh et al. |
| 6,107,189 A | 8/2000 | Wald et al. |
| 6,140,172 A | 10/2000 | Parekh |
| 6,177,695 B1 | 1/2001 | Jeng |
| 6,180,450 B1 | 1/2001 | Dennison et al. |
| 6,214,727 B1 | 4/2001 | Parekh |
| 6,228,710 B1 | 5/2001 | Parekh et al. |
| 6,228,738 B1 | 5/2001 | Parekh et al. |
| 6,232,176 B1 | 5/2001 | Parekh et al. |
| 6,238,971 B1 | 5/2001 | Parekh et al. |
| 6,245,631 B1 | 6/2001 | Agarwal et al. |
| 6,284,641 B1 | 9/2001 | Parekh |
| 6,297,525 B1 | 10/2001 | Parekh et al. |
| 6,300,215 B1 * | 10/2001 | Shin .................. 438/396 |
| 6,312,988 B1 | 11/2001 | Lowrey et al. |
| 6,323,080 B1 | 11/2001 | Parekh |
| 6,329,682 B1 | 12/2001 | Parekh et al. |
| 6,329,684 B1 | 12/2001 | Parekh et al. |
| 6,334,692 B1 * | 1/2002 | Hsueh .................. 362/116 |
| 6,337,274 B1 | 1/2002 | Hu et al. |
| 6,344,692 B1 * | 2/2002 | Ikemasu et al. ............ 257/758 |
| 6,359,302 B1 | 3/2002 | Parekh et al. |
| 6,368,962 B2 | 4/2002 | Hu et al. |
| 6,376,301 B2 | 4/2002 | Parekh et al. |
| 6,376,380 B1 | 4/2002 | Tang et al. |
| 6,383,868 B1 | 5/2002 | Parekh et al. |
| 6,407,455 B1 | 6/2002 | Wald et al. |
| 6,429,476 B2 * | 8/2002 | Suzuki et al. ............... 257/296 |
| 6,458,649 B1 | 10/2002 | Zahurak et al. |
| 6,468,859 B1 | 10/2002 | Parekh et al. |
| 6,486,060 B2 | 11/2002 | Hermes et al. |
| 6,500,709 B2 | 12/2002 | Parekh et al. |
| 6,524,907 B2 | 2/2003 | Parekh et al. |
| 6,589,876 B1 | 7/2003 | Tran |
| 6,617,635 B2 | 9/2003 | Parekh et al. |
| 6,734,479 B1 * | 5/2004 | Ogishima et al. .......... 257/296 |
| 2004/0110341 A1 | 6/2004 | Park |

* cited by examiner

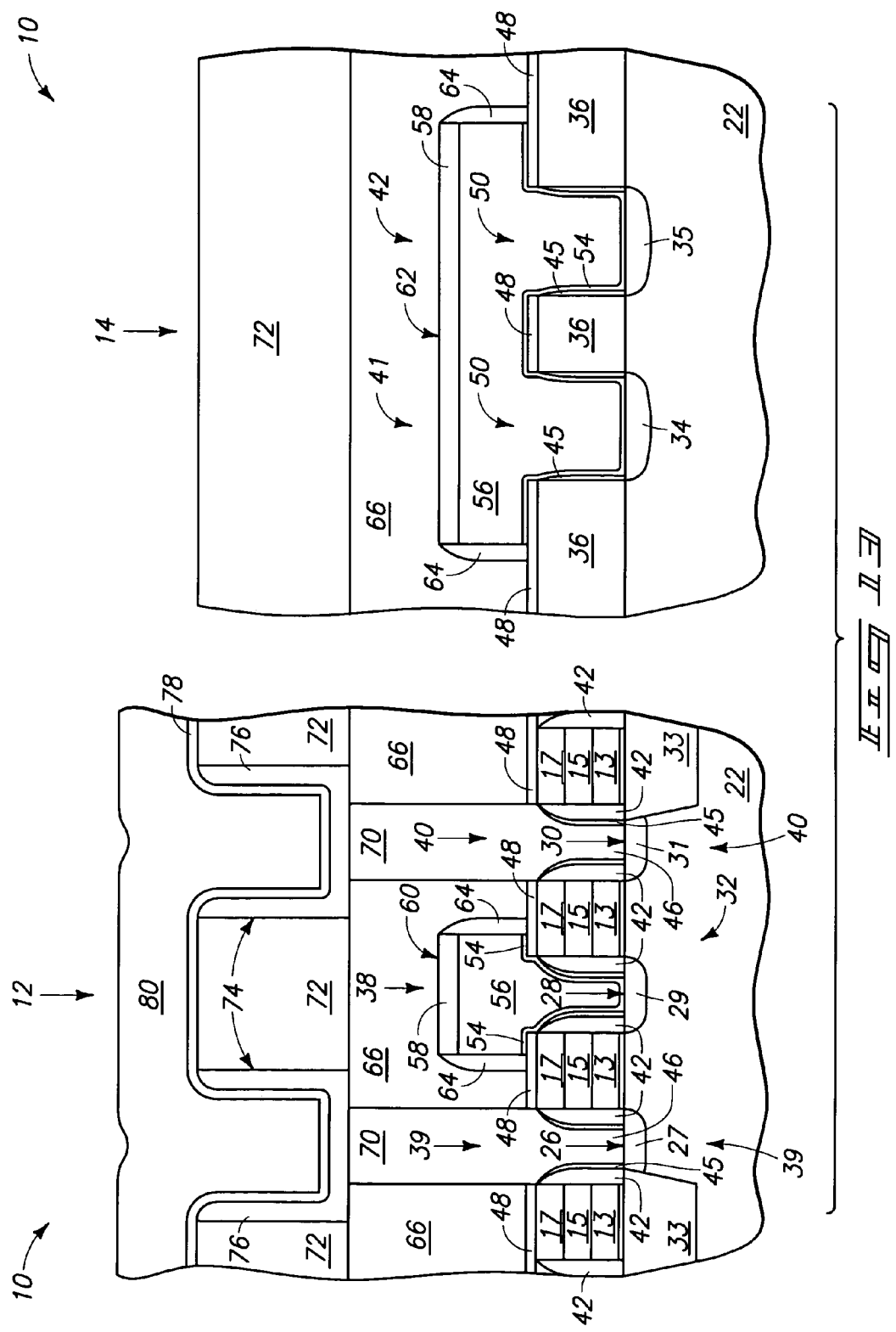

SEMICONDUCTOR SUBSTRATE HAVING FIRST AND SECOND PAIRS OF WORD LINES

RELATED PATENT DATA

This patent resulted from a continuation application of U.S. patent application Ser. No. 11/135,534, filed May 23, 2005, now U.S. Pat. No. 7,008,843 entitled "Methods of Forming Memory Circuitry", naming Kunal R. Parekh and Byron N. Burgess as inventors, the disclosure of which is incorporated by reference, which resulted from a continuation application of U.S. patent application Ser. No. 10/615,287, filed Jul. 7, 2003, entitled "Methods of forming Memory Circuitry", naming Kunal R. Parekh and Byron N. Burgess as inventors, and which is now U.S. Pat. No. 6,921,692, the disclosure of which is incorporated by reference.

TECHNICAL FIELD

The invention is related to methods of forming memory circuitry.

BACKGROUND OF THE INVENTION

Many types of memory circuitry utilize a combination of word lines, bit lines and capacitors which are arranged to form one or more memory arrays. In some instances, the bit lines are formed elevationally higher than or overlapping with the capacitors, while in other instances the bit lines are formed elevationally lower than the capacitors. Regardless, peripheral control or other circuitry is commonly fabricated at some location external to the array, and is conventionally referred to as peripheral circuitry. Such circuitry typically includes local interconnect lines which interconnect various conductive nodes of different devices in the peripheral circuitry. Such nodes might constitute metal or metal compounds and/or diffusion regions of common or differing conductivity types.

While the invention was motivated in addressing processing associated with the above-described circuitry, it is in no way so limited. The invention is only limited by the accompanying claims as literally worded, without interpretative or other limiting reference to the specification, and in accordance with the doctrine of equivalents.

SUMMARY OF THE INVENTION

The invention includes methods of forming memory circuitry. In one implementation, a semiconductor substrate includes a pair of word lines having a bit node received therebetween. A bit node contact opening is formed within insulative material over the bit node. Sacrificial plugging material is formed within the bit node contact opening between the pair of word lines. Sacrificial plugging material is removed from the bit node contact opening between the pair of word lines, and it is replaced with conductive material that is in electrical connection with the bit node. Thereafter, the conductive material is formed into a bit line.

Other aspects and implementations are contemplated.

BRIEF DESCRIPTION OF THE DRAWINGS

Preferred embodiments of the invention are described below with reference to the following accompanying drawings.

FIG. 10 is a view of the FIG. 9 wafer fragments at a processing step subsequent to that shown by FIG. 9.

FIG. 13 is a view of the FIG. 12 wafer fragments at a processing step subsequent to that shown by FIG. 12.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
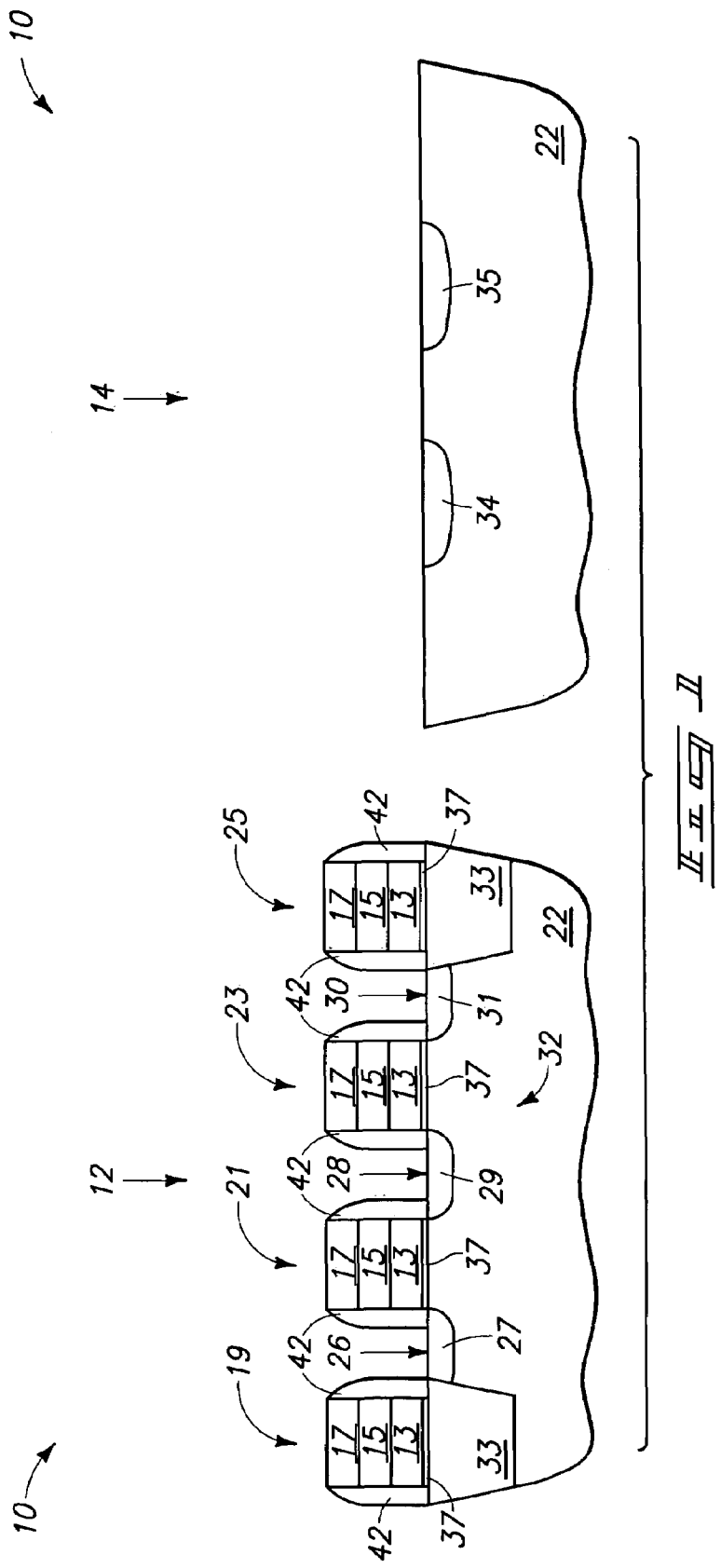
FIG. 1 is a fragmented, diagrammatic sectional view of semiconductor wafer fragments in process in accordance with an aspect of the invention.

Exemplary preferred embodiments of methods of forming memory circuitry are described with reference to FIGS. 1-13. The particular circuitry described is with respect to DRAM circuitry and with respect to buried bit line memory circuitry. However, certain aspects of the invention are in no way so limited. Referring to FIG. 1, a semiconductor wafer fragment in process is shown generally with reference numeral 10, and includes a semiconductive substrate 22. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural unless otherwise indicated. Substrate 22 is shown in the form of bulk monocrystalline substrate, although semiconductor-on-insulator substrates and any other semiconductor substrate, whether existing or yet-to-be developed, are of course contemplated. The preferred embodiment substrate 10 is depicted as having a memory array area 12 and a peripheral circuitry area 14 peripheral to memory array 12.

A plurality of spaced-apart word lines 19, 21, 23 and 25 is formed over substrate 22, and in part defines individual substrate locations 26, 28 and 30 with which electrical communication is desired. Substrate locations 26 and 30, on opposite sides of substrate location 28, constitute locations with which electrical communication will be established with individual storage capacitors, and are referred to herein as capacitor nodes. Substrate location 28 constitutes a location with which electrical communication will be established with a bit line, and is herein referred to as a bit node. In a preferred embodiment, the substrate locations comprise diffusion regions 27, 29 and 31, respectively, which are received within substrate 22. However of course, nodes 26, 28 and 30 might comprise other structures, for example elevated source/drains, plugs, etc., and include one or more conductive/semiconductive layers and whether existing or yet-to-be developed.

Word lines 19, 21, 23 and 25, and substrate locations 26, 28 and 30, are formed relative to an active area 32 which is isolated relative to other active areas by isolation regions 33, and which can be formed through conventional or yet-to-be developed techniques, such as shallow trench isolation. Each exemplary preferred embodiment word line is depicted as including a gate oxide layer 37, a polysilicon layer 13 and a silicide or higher conductive layer 15. An insulative cap 17 is provided, as are insulative sidewall spacers 42. Other word line constructions and or materials can, of course, be utilized. For purposes of the continuing discussion, word lines 21 and 23 can be considered as comprising a first pair of word lines having a bit node 28/29 received therebetween, and word lines 23 and 25 can be considered as a second pair of word lines having a capacitor node 30/31 received therebetween.

Peripheral circuitry area 14, by way of example only, is depicted as having a first node 34 and a second node 35. Such might constitute common or differing conductivity diffusion regions, as depicted, or might constitute any other conductive material node location where it is desired in one implementation to form some sort of local interconnecting line interconnecting a first node and a second node in the peripheral circuitry area.

Figure 2:
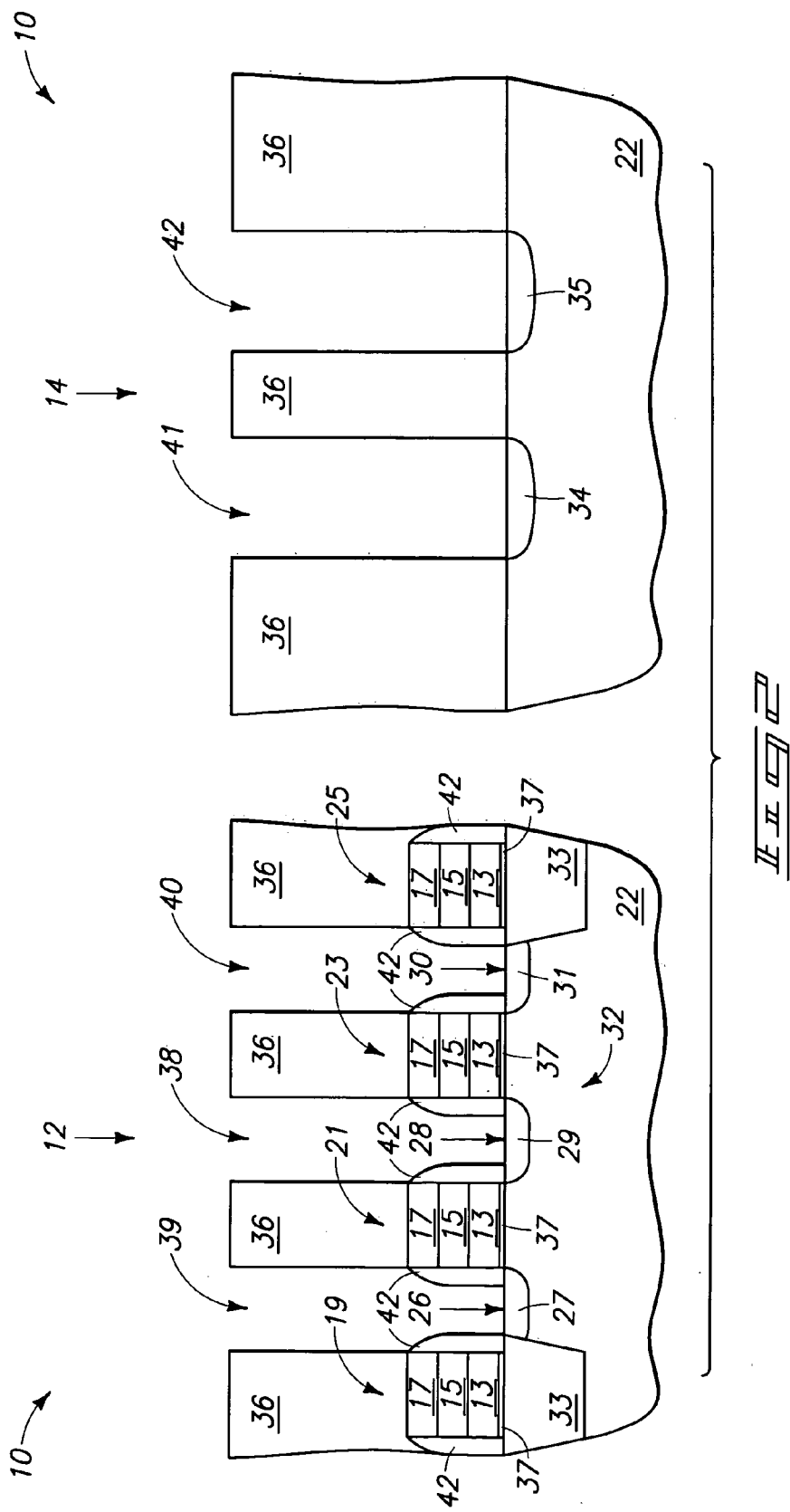
FIG. 2 is a view of the FIG. 1 wafer fragments at a processing step subsequent to that shown by FIG. 1.

Referring to FIG. 2, insulative material 36 has been formed as part of substrate 10. An exemplary material is borophosphosilicate glass (BPSG), for example formed over an underlying layer (not specifically shown) of undoped silicon dioxide. Material 36 in the preferred embodiment has been planarized, for example by CMP, although planarization is of course not required. Further if planarized, such might be conducted to produce an alternate construction, for example layer 36 could be planarized at least to the outer surface of caps 17. Regardless, a bit node contact opening 38 over bit node 28, capacitor node contact openings 39 and 40 over capacitor nodes 26 and 30, respectively, a first peripheral contact opening 41 over first node 34, and a second peripheral contact opening 42 over second node 35 have been formed within insulative material 36. Most preferably, the depicted contact openings are commonly formed, for example utilizing lithographic (i.e., photolithographic) patterning and etch steps which are common to the formation of the depicted contact openings. In the context of this document, "commonly forming" or "commonly formed", and "commonly replaced" or "commonly replacing", requires at least one or more processing steps which are common to the formation or removing of the stated material, structure or opening. Of course, the invention contemplates the fabrication of any and only a single one, or any subset, of the depicted contact openings as supported by the literal wording of the accompanying claims. However in the depicted embodiment, all openings are formed (preferably commonly) as shown in FIG. 2, and regardless whether material 36 has been planarized, and if so to what degree or point.

Figure 3:
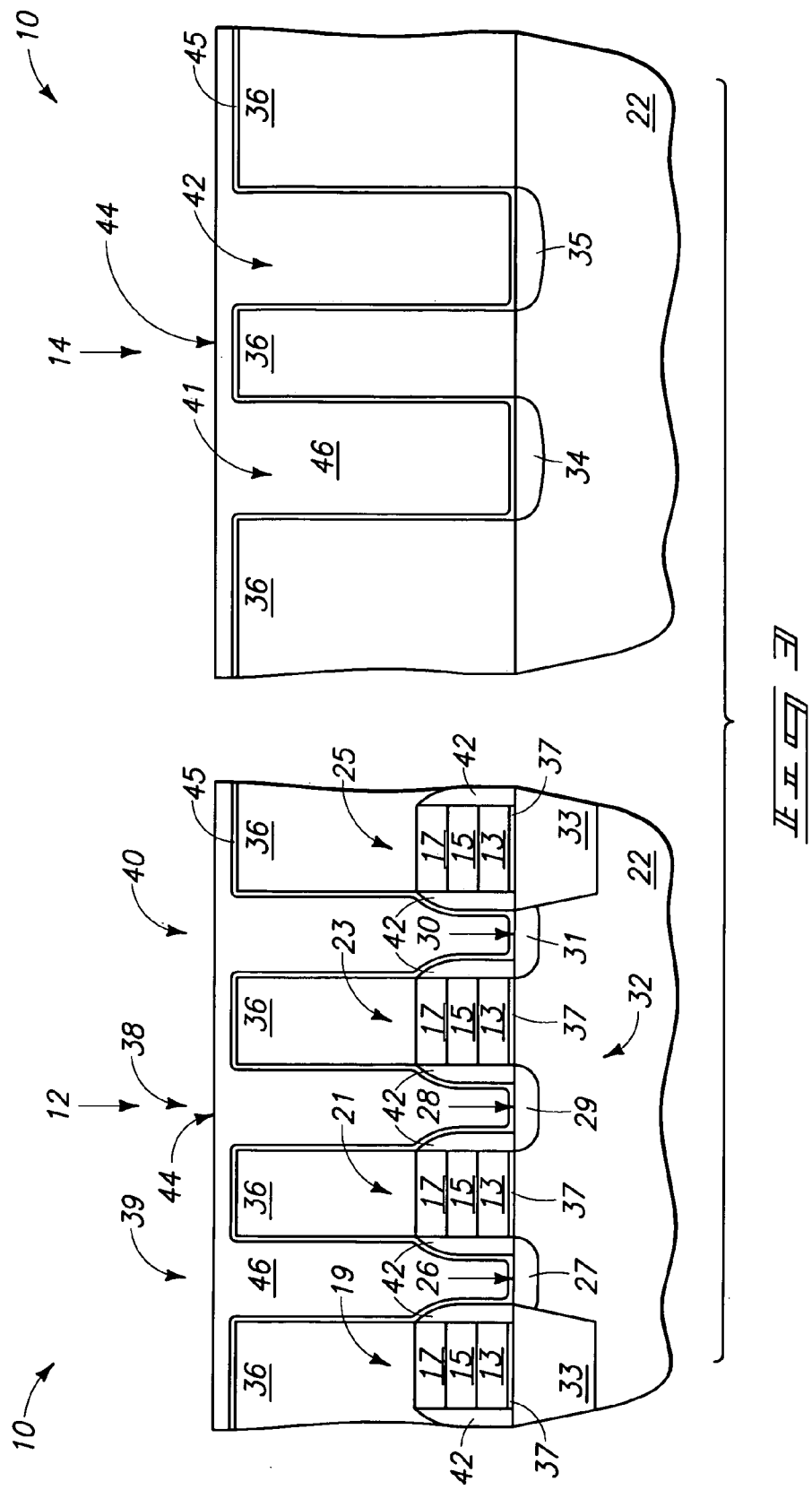
FIG. 3 is a view of the FIG. 2 wafer fragments at a processing step subsequent to that shown by FIG. 2.

Referring to FIG. 3, sacrificial plugging material 44 is formed within bit node contact opening 38, capacitor node contact openings 39 and 40, first peripheral contact opening 41 and second peripheral contact opening 42. The sacrificial plugging material might comprise insulative material, conductive material (including conductively doped semiconductive material) and/or semiconductive material regardless of whether conductively doped. By way of example only and in the depicted preferred embodiment, sacrificial plugging material 44 is shown as being in the form of a thin insulative liner 45 (i.e., silicon nitride or undoped silicon dioxide) having a doped or undoped planarized layer of polysilicon 46 formed thereover. Such are exemplary preferred materials where diffusion regions 27, 29, 31, 34 and 35 comprise silicon to provide an etch stopping barrier between preferred polysilicon material 46 and such diffusion regions, as will be apparent from the continuing discussion. Alternately by way of example only in the depicted embodiment, an interfacing etch stopping oxide might be formed essentially only at node locations 26, 28, 30, 34 and 35 by a thermal or plasma oxidation of the material of the respective diffusion regions. Regardless, in the exemplary preferred embodiment, sacrificial plugging material 44 is commonly formed with respect to openings 38, 39, 40, 41 and 42.

Figure 4:
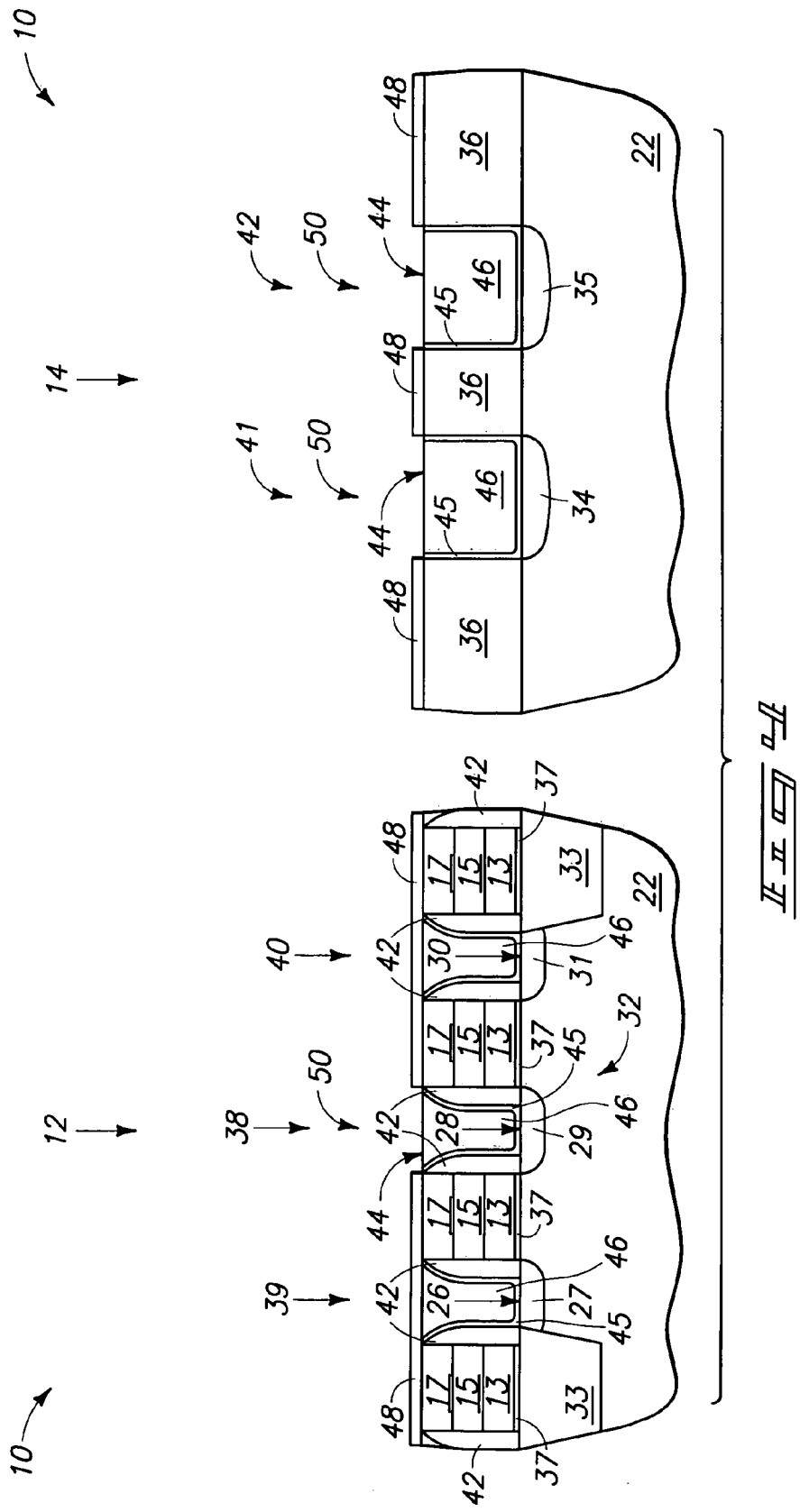
FIG. 4 is a view of the FIG. 3 wafer fragments at a processing step subsequent to that shown by FIG. 3.

Referring to FIG. 4, sacrificial plugging material 44 and insulative material 36 have been planarized back (i.e., by chemical-mechanical polishing) proximate to, more preferably at least to, an outer surface of insulative caps 17. Thereafter, an insulating layer 48 has been deposited. An exemplary material is undoped silicon dioxide deposited by decomposition of tetraethylorthosilicate, with an exemplary thickness for layer 48 being 400 Angstroms. Contact openings/removal openings 50 have been etched therethrough to sacrificial plugging material 44 within bit node contact opening 38, first peripheral contact opening 41 and second peripheral contact opening 42. Exemplary preferred techniques for doing so include lithographic patterning and etch.

Figure 5:
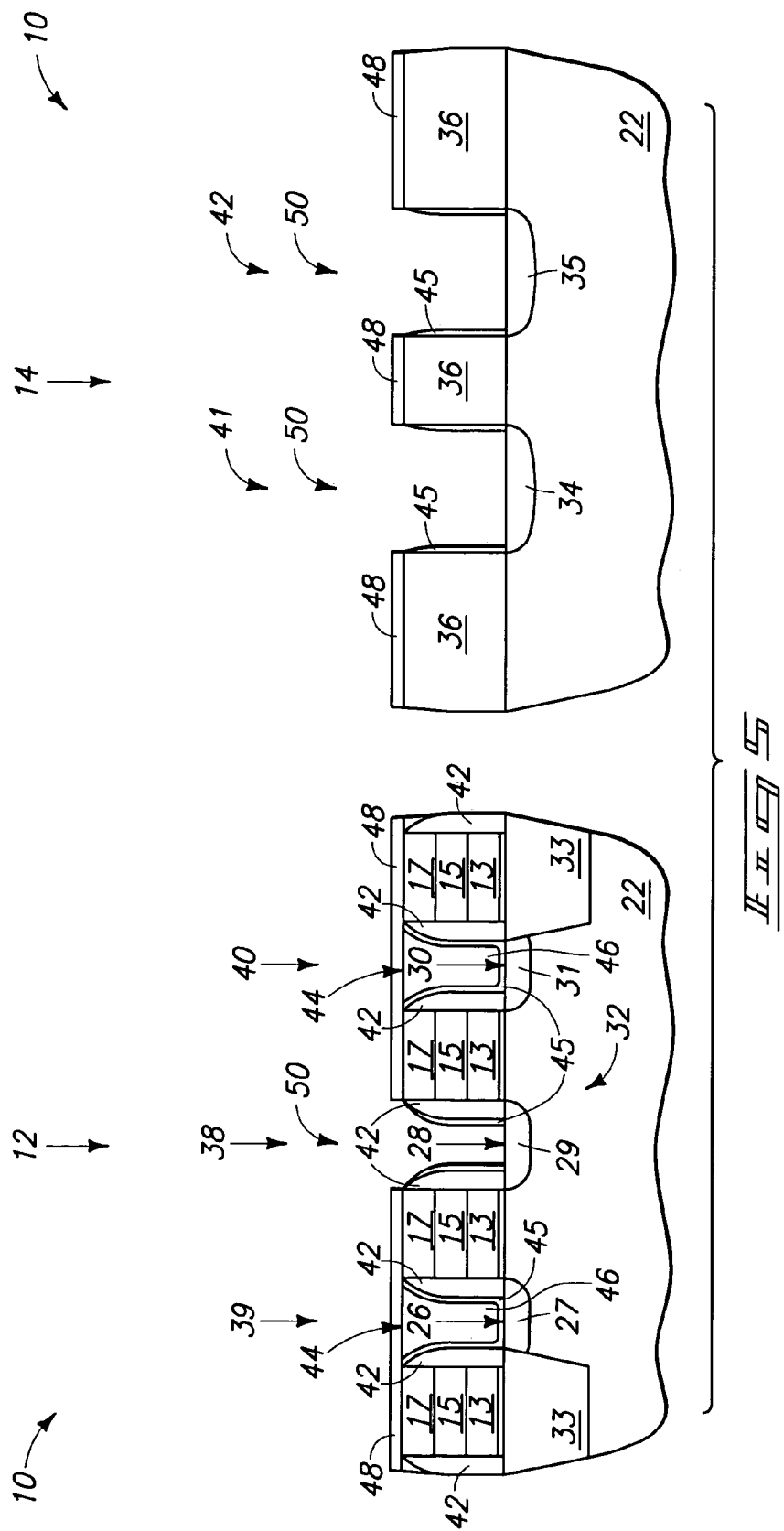
FIG. 5 is a view of the FIG. 4 wafer fragments at a processing step subsequent to that shown by FIG. 4.

Referring to FIG. 5, sacrificial plugging material 44 has been removed from bit contact opening 38, first peripheral contact opening 41 and second peripheral contact opening 42 while leaving sacrificial plugging 44 within capacitor node contact openings 39 and 40. Preferred removing techniques are by etching, with such etching removing the sacrificial plugging material from the bit node, first peripheral and second peripheral contact openings through removal openings 50. For example, where the sacrificial plugging material includes a polysilicon material 46, an exemplary etching chemistry is aqueous tetramethylammonium hydroxide. This can be followed by a short timed etch of insulative layer 45 (for example using an HF based chemistry for silicon dioxide, a fluorocarbon chemistry for silicon nitride) to clear layer 45 from over nodes 28, 34 and 35, as shown.

Figure 6:
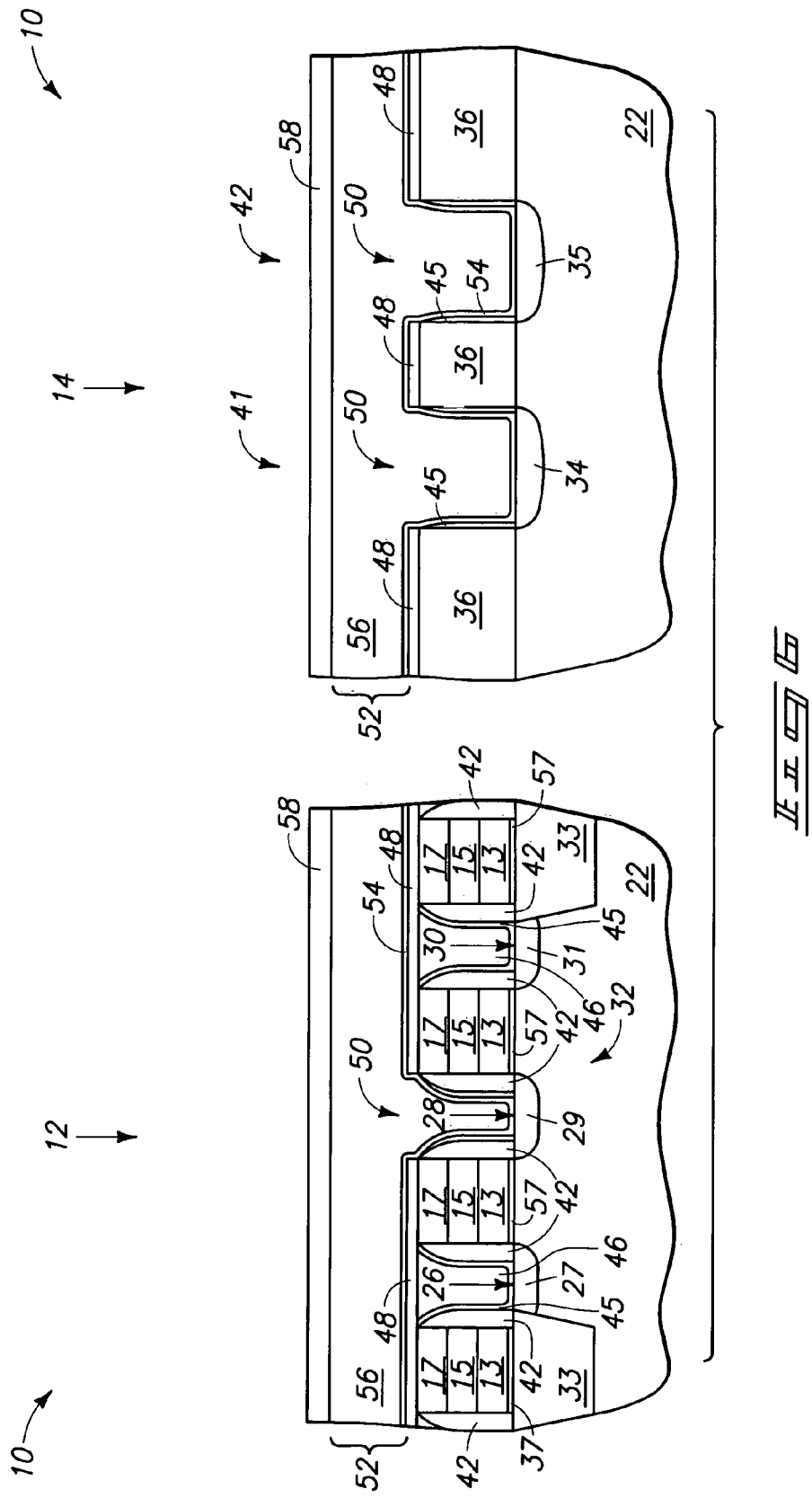
FIG. 6 is a view of the FIG. 5 wafer fragments at a processing step subsequent to that shown by FIG. 5.

Referring to FIG. 6, the removed sacrificial plugging material has been replaced with conductive material 52 that is in electrical connection with bit node 28, first node 34 and second node 35. Preferably, such material is commonly replaced by deposition common to the substrate and the respective openings to result in the exemplary FIG. 6 construction. In the illustrated example, conductive material 52 comprises a first layer 54 and a second layer 56. By way of example only, layer 54 might be formed to provide a diffusion barrier function between substrate 22 and conductive layer 56, and/or to provide an adhesion/glue layer function to facilitate adherence of layer 56 to the ultimate substrate. By way of example only, exemplary materials for layer 54 include conductive metal silicides (whether chemical vapor deposited or formed by a silicide or other process), and conductive metal nitrides (whether stoichiometric, enriched in metal or other material), as well as any other conductive material. An exemplary material for layer 56 is an elemental metal or an elemental alloy, for example tungsten. Of course, conductive material 52 could comprise a single, or more than the illustrated two, layers and be any conductive material, including conductively doped semiconductive material. An insulative capping layer 58 (i.e., silicon nitride) is formed over conductive material 52.

Figure 7:
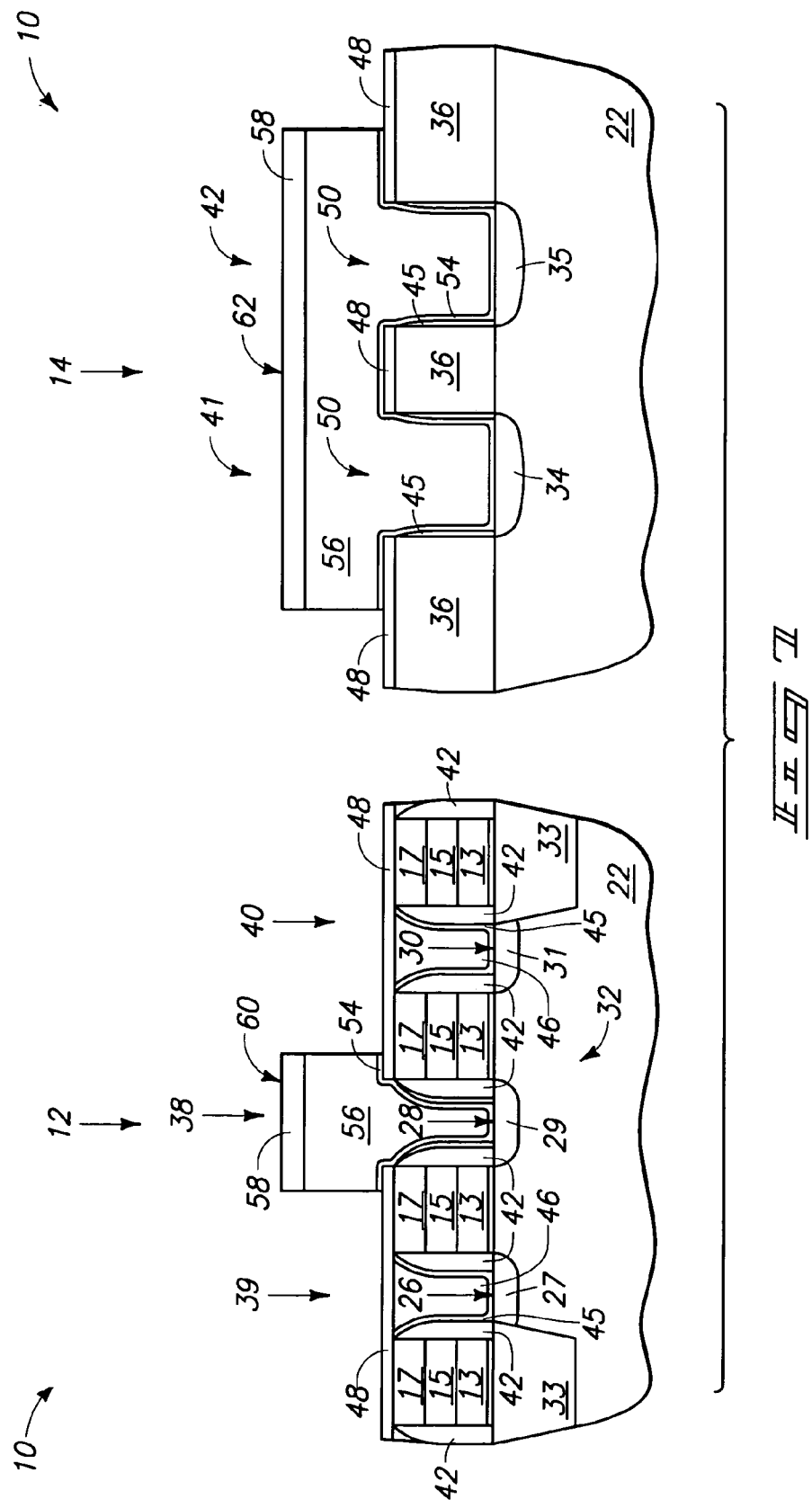
FIG. 7 is a view of the FIG. 6 wafer fragments at a processing step subsequent to that shown by FIG. 6.
Figure 8:
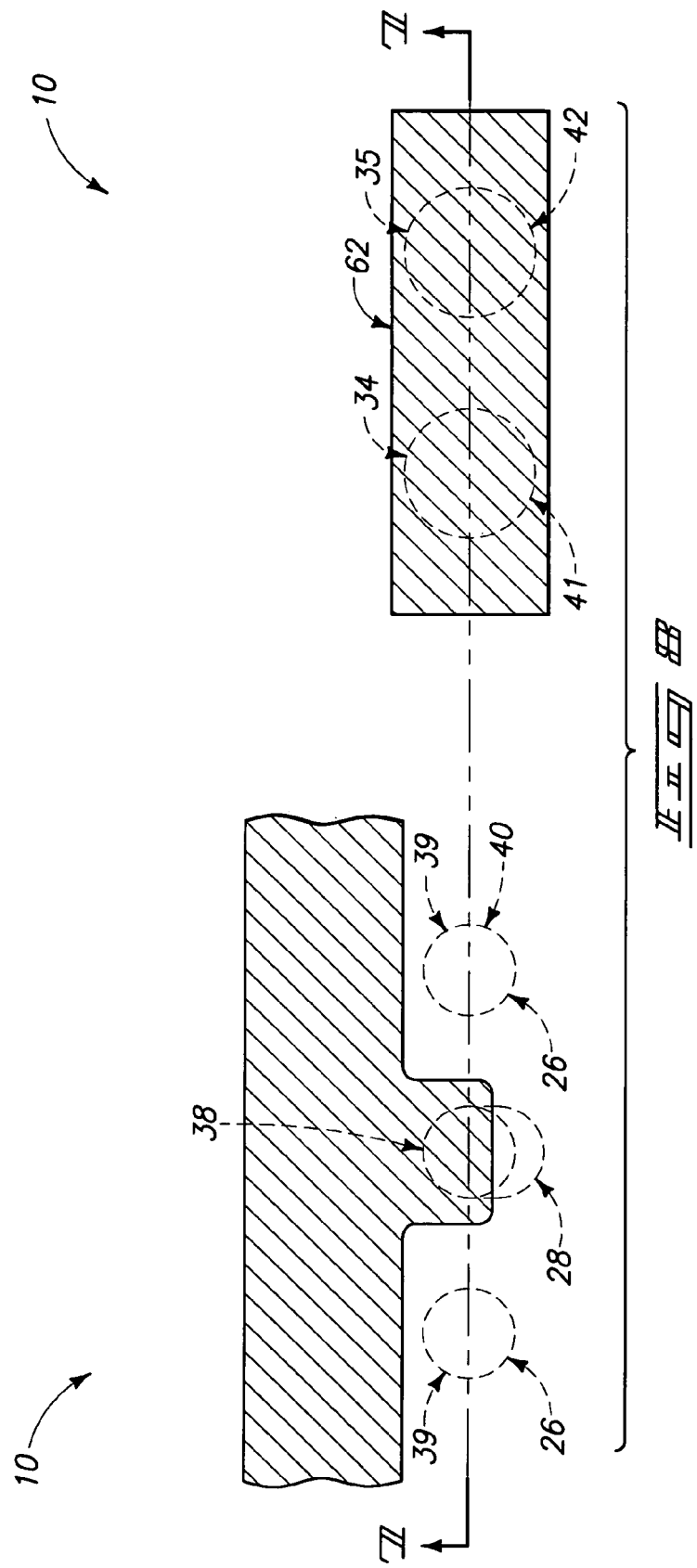
FIG. 8 is a diagrammatic top plan view of FIG. 7.

Referring to FIGS. 7 and 8, conductive material 52 has been formed into a bit line 60 and a local interconnect line 62. The top plan layout depicted by FIG. 8 is merely an exemplary layout. Alternate layouts, whether existing or yet-to-be developed, could also of course be employed, for example as shown in our U.S. Pat. No. 6,458,649. An exemplary preferred method for forming the conductive material into the illustrated bit line and local interconnect line includes lithography (i.e., photolithography) and etch. However, any method of forming the respective materials into one or both of the illustrated lines is contemplated, whether existing or yet-to-be developed. For example, and by way of example only, such bit line forming could be by a damascene process. For example, some suitable insulative material could be deposited over the FIG. 5 construction, with desired line-shaped troughs and contact openings etched therein. Conductive material could then be formed to overfill such troughs and openings and the conductive material planarized back to define the desired isolated conductive line outlines. In one preferred embodiment, the illustrated patterning to form lines 60 and 62 comprises lithography and etch using at least some common lithographic and etching steps to the depicted layers, for example such that a single masking is conducted.

Figure 9:
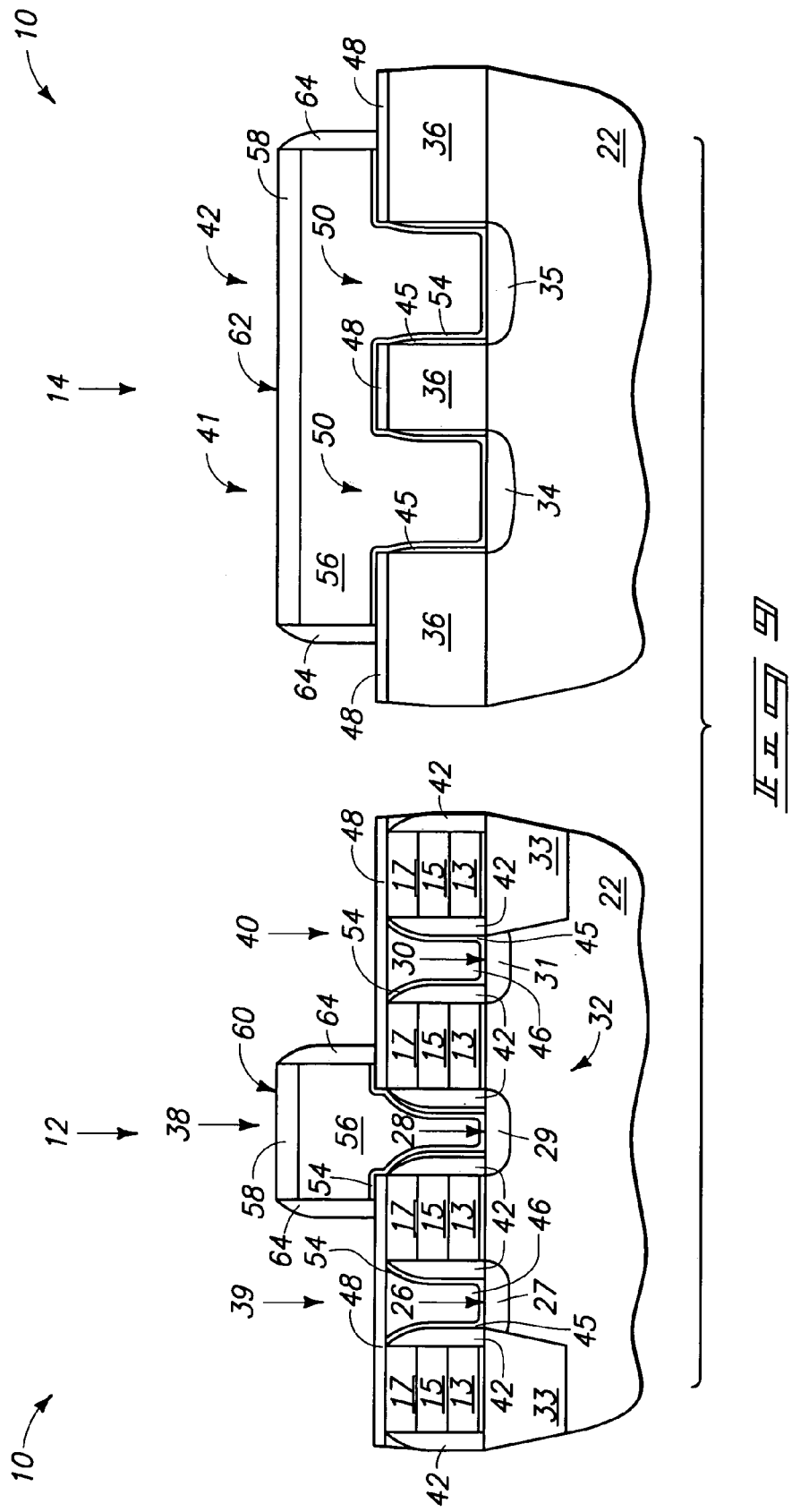
FIG. 9 is a view of the FIG. 7 wafer fragments at a processing step subsequent to that shown by FIG. 7.

Referring to FIG. 9, anisotropically etched insulative sidewall spacers 64 have been formed about the respective lines 60 and 62. An exemplary preferred material is silicon nitride.

Subsequent processing will preferably form a capacitor of a memory cell of the memory circuitry after having formed the bit line and local interconnect line. Such is shown, by way of example only, with respect to FIGS. 10-13. Referring to FIG. 10, another insulative layer 66 has been deposited. An exemplary material is BPSG. Openings 68 have been formed therethrough, and through insulative material 48 over sacrificial plugging material 44 received within remnant portions of capacitor node contact openings 39 and 40.

Figure 11:
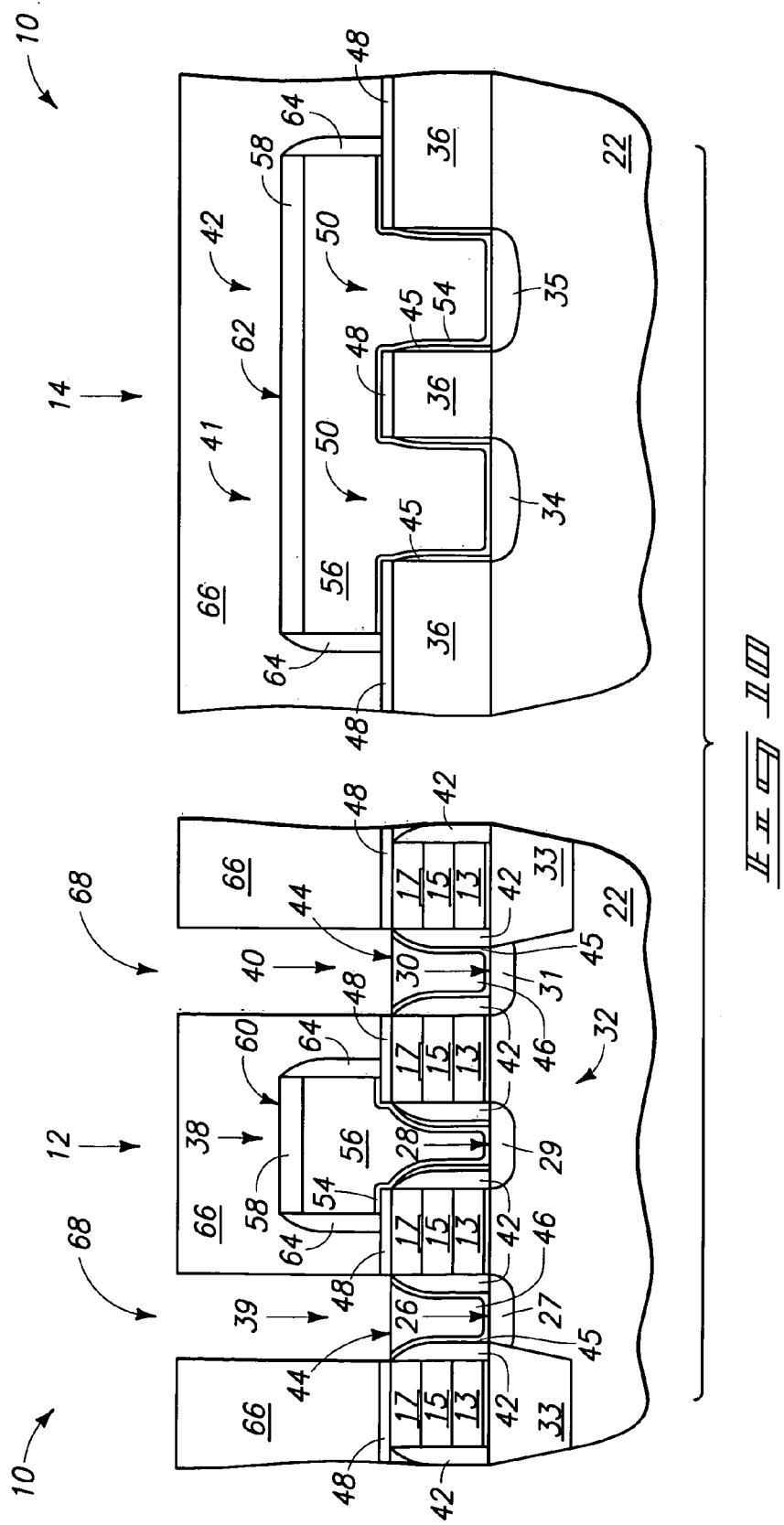
FIG. 11 is a view of the FIG. 10 wafer fragments at a processing step subsequent to that shown by FIG. 10
Figure 11:
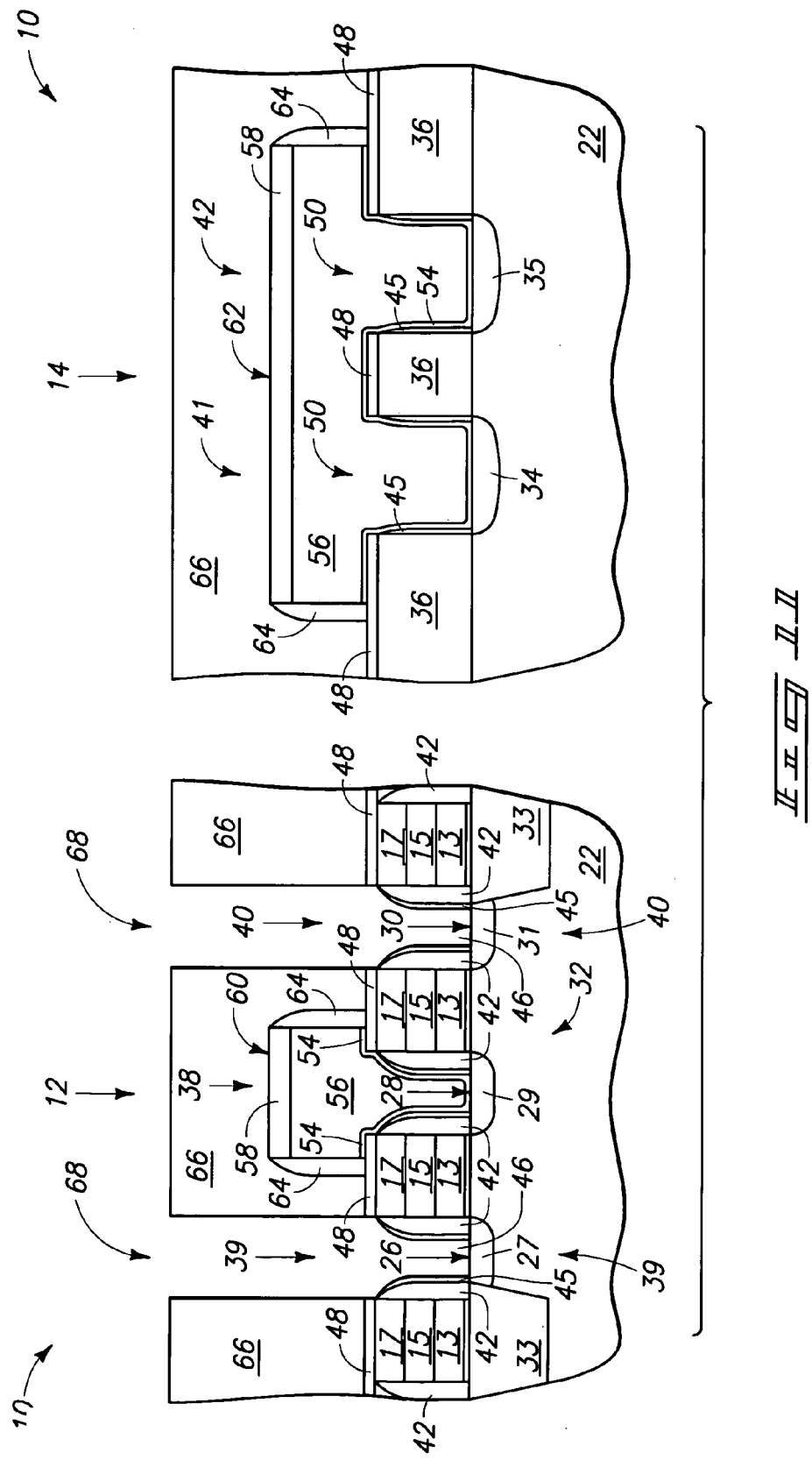

Referring to FIG. 11, sacrificial plugging material 44 has been removed from capacitor node contact openings 39 and 40, for example as described above with respect to sacrificial material removal from openings 38, 41 and 42.

Figure 12:
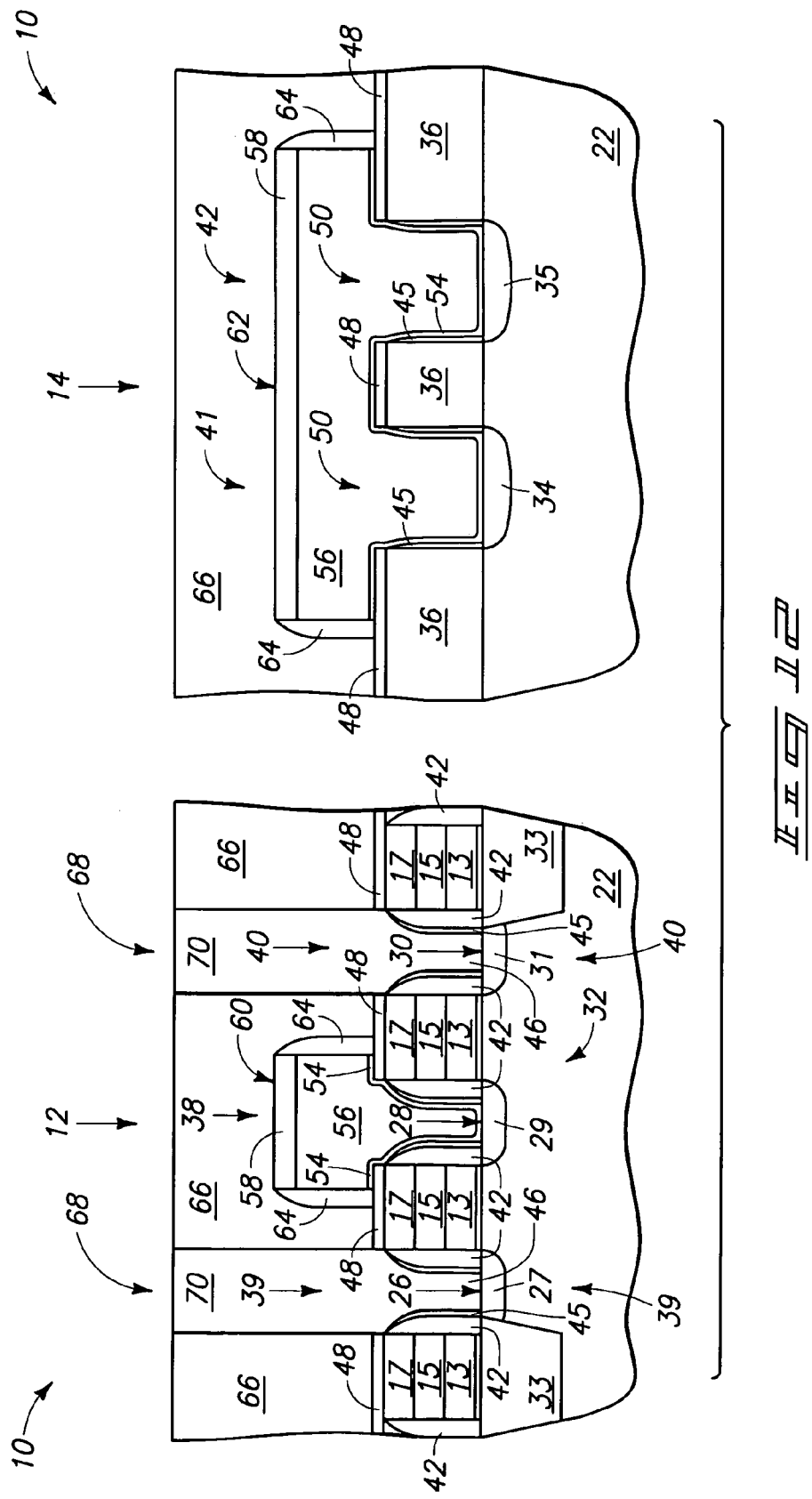
FIG. 12 is a view of the FIG. 11 wafer fragments at a processing step subsequent to that shown by FIG. 11.

Referring to FIG. 12, conductive material 70 has been deposited and planarized back to fill openings 68. Such might, of course, include more than one conductive material.

Referring to FIG. 13, another insulative layer 72 has been deposited. Storage node container openings 74 have been formed therein, and a storage node 76, a capacitor dielectric layer 78 and a common outer capacitor plate 80 formed, as shown. Further and by way of example only, a contact opening (not shown) could be formed to local interconnect line 62 commensurate with the forming of container openings 74.

Such provides but one example of forming exemplary capacitors of respective memory cells of memory circuitry in electrical connection with capacitor nodes 26 and 30, and whereby an elevationally outermost electrode (i.e., 80) of a capacitor is received everywhere elevationally outward of the illustrated bit line. Of course, attributes of the invention might be practiced in the formation of memory circuitry not comprising buried bit line memory cells without departing from certain principles and aspects of the invention.

By way of example only, and not in any way of limitation, the invention might provide an advantage over certain previous technology in the provision of low resistant contacts to the digit line node while enabling the commensurate fabrication of one, more or all local interconnect lines within the periphery between various metal, metal compound, n+ and p+ regions, with reduced masking steps where masking is utilized.

In compliance with the statute, the invention has been described in language more or less specific as to structural and methodical features. It is to be understood, however, that the invention is not limited to the specific features shown and described, since the means wherein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor substrate comprising:
    a first pair of word lines having a bit node formed within semiconductive material of the substrate between the first pair of word lines, and a second pair of word lines having a capacitor node formed within semiconductive material of the substrate between the second pair of word lines, the first and second pair of word lines comprising conductive material;
    insulative material between the first pair of word lines over the bit node and between the second pair of word lines over the capacitor node;
    polysilicon between the first pair of word lines over the insulative material over the bit node and between the second pair of word lines over the insulative material over the capacitor node, the polysilicon being electrically isolated from the bit node and from the capacitor node, the polysilicon not being received elevationally over the conductive material of the first and second pair of word lines;
    an insulative layer over the first and second pairs of word lines and over the polysilicon and the insulative material which is between the second pair of word lines; and
    an opening through the insulative layer which outwardly exposes the polysilicon between the first pair of word lines.

2. The substrate of claim 1, wherein the insulative material comprises silicon dioxide.

3. The substrate of claim 1, wherein the insulative material comprises silicon nitride.

4. The substrate of claim 1, wherein the polysilicon is conductively doped.

5. The substrate of claim 1, wherein the polysilicon is undoped.

6. The substrate of claim 1, wherein the insulative layer has a planar outermost surface.

7. The substrate of claim 1, wherein the insulative layer comprises silicon dioxide.

8. The substrate of claim 1, wherein the insulative layer comprises undoped silicon dioxide.

9. The substrate of claim 1, wherein the insulative layer and the insulative material are of the same composition.

10. The substrate of claim 1, wherein the insulative layer and the insulative material are of different compositions.

11. The substrate of claim 1, wherein the insulative material is received on the bit node and on the capacitor node.

12. The substrate of claim 1, wherein the polysilicon is received on the insulative material over the bit node and on the insulative material over the capacitor node.

13. The substrate of claim 1, wherein,
the insulative material is received on the bit node and on the capacitor node; and
the polysilicon is received on the insulative material which is on the bit node and on the insulative material which is on the capacitor node.

14. The substrate of claim 1, wherein the insulative layer is received on the polysilicon between the second pair of word lines.

15. A semiconductor substrate comprising:
a first pair of word lines having a bit node formed within semiconductive material of the substrate between the first pair of word lines, and a second pair of word lines having a capacitor node formed within semiconductive material of the substrate between the second pair of word lines, the first and second pair of word lines comprising conductive material;
insulative material between the second pair of word lines over the capacitor node;
polysilicon between the second pair of word lines over the insulative material over the capacitor node, the polysilicon being electrically isolated from the capacitor node, the polysilicon not being received elevationally over the conductive material of the second pair of word lines;
an insulative layer over the first and second pairs of word lines and over the polysilicon and the insulative material which is between the second pair of word lines; and
an opening through the insulative layer which outwardly exposes the bit node between the first pair of word lines.

16. The substrate of claim 15, wherein the insulative material comprises silicon dioxide.

17. The substrate of claim 15, wherein the insulative material comprises silicon nitride.

18. The substrate of claim 15, wherein the polysilicon is conductively doped.

19. The substrate of claim 15, wherein the polysilicon is undoped.

20. The substrate of claim 15, wherein the insulative layer has a planar outermost surface.

21. The substrate of claim 15, wherein the insulative layer comprises silicon dioxide.

22. The substrate of claim 15, wherein the insulative layer comprises undoped silicon dioxide.

23. The substrate of claim 15, wherein the insulative layer and the insulative material are of the same composition.

24. The substrate of claim 15, wherein the insulative layer and the insulative material are of different compositions.

25. The substrate of claim 15, wherein the insulative material is received on the capacitor node.

26. The substrate of claim 15, wherein the polysilicon is received on the insulative material over the capacitor node.

27. The substrate of claim 15, wherein,
the insulative material is received on the capacitor node; and
the polysilicon is received on the insulative material which is on the capacitor node.

28. The substrate of claim 15, wherein the insulative layer is received on the polysilicon between the second pair of word lines.

29. A semiconductor substrate comprising:
a memory array area and a peripheral circuitry area peripheral to the memory array area, the substrate comprising a first pair of word lines having a bit node formed within semiconductive material of the substrate between the first pair of word lines, and a second pair of word lines having a capacitor node formed within semiconductive material of the substrate between the second pair of word lines, the bit node and the capacitor node being received within the memory array area, first and second spaced nodes in the peripheral circuitry area;
insulative material between the first pair of word lines over the bit node within the memory array area, between the second pair of word lines over the capacitor node within the memory array area, and over the first and second nodes in the peripheral circuitry area;
polysilicon between the first pair of word lines over the insulative material over the bit node within the memory array area, between the second pair of word lines over the insulative material over the capacitor node within the memory array area, and over the first and second nodes in the peripheral circuitry area; the polysilicon being electrically isolated from the bit node, from the capacitor node, and from the first and second nodes;
an insulative layer over the first and second pairs of word lines and over the polysilicon and the insulative material which is between the second pair of word lines; and
openings through the insulative layer which outwardly expose the polysilicon between the first pair of word lines, the polysilicon over the first node, and the polysilicon over the second node.

30. The substrate of claim 29, wherein the polysilicon is conductively doped.

31. The substrate of claim 29, wherein the polysilicon is undoped.

32. A semiconductor substrate comprising:
a first pair of word lines having a bit node formed within semiconductive material of the substrate between the first pair of word lines, and a second pair of word lines having a capacitor node formed within semiconductive material of the substrate between the second pair of word lines, the bit node comprising a conductive diffusion region formed in bulk semiconductive material of the semiconductive substrate;
insulative material between the second pair of word lines over the capacitor node;
polysilicon between the second pair of word lines over the insulative material over the capacitor node, the polysilicon being electrically isolated from the capacitor node;
an insulative layer over the first and second pairs of word lines and over the polysilicon and the insulative material which is between the second pair of word lines; and
an opening through the insulative layer which outwardly exposes the conductive diffusion region of the bit node formed in the bulk semiconductive material between the first pair of word lines.

33. The substrate of claim 32, wherein the polysilicon is conductively doped.

34. The substrate of claim 32, wherein the polysilicon is undoped.

35. A semiconductor substrate comprising:
a memory array area and a peripheral circuitry area peripheral to the memory array area, the substrate comprising a first pair of word lines having a bit node formed within semiconductive material of the substrate between the first pair of word lines, and a second pair of word lines having a capacitor node formed within semiconductive material of the substrate between the second pair of word lines, the bit node and the capacitor node being received within the memory array area, first and second spaced nodes in the peripheral circuitry area;

insulative material between the second pair of word lines over the capacitor node within the memory array area;

polysilicon between the second pair of word lines over the insulative material over the capacitor node within the memory array area, the polysilicon being electrically isolated from the capacitor node;

an insulative layer over the first and second pairs of word lines and over the polysilicon and the insulative material which is between the second pair of word lines; and openings through the insulative layer which outwardly expose the bit node between the first pair of word lines, the first node, and the second node.

* * * * *